United States Patent [19]
White

[11] Patent Number: 5,229,255
[45] Date of Patent: Jul. 20, 1993

[54] SUB-MICRON DEVICE FABRICATION WITH A PHASE SHIFT MASK HAVING MULTIPLE VALUES OF PHASE DELAY

[75] Inventor: Donald L. White, Lake Parsippany, N.J.

[73] Assignee: AT&T Bell Laboratories, Murray Hill, N.J.

[21] Appl. No.: 673,614

[22] Filed: Mar. 22, 1991

[51] Int. Cl.⁵ .............................................. G03F 9/00
[52] U.S. Cl. ........................................ 430/311; 430/22; 430/269; 430/5
[58] Field of Search ................. 430/5, 311, 269, 22

[56] References Cited

U.S. PATENT DOCUMENTS 4,806,442  2/1989  Shirasaki et al. .................... 430/4
5,045,417  9/1991  Okamoto ............................. 430/5

OTHER PUBLICATIONS

M. D. Levinson et al. *IEEE Trans. Electron Devices*, vol. ED-29, p. 1828, (1982).

Primary Examiner—Marion E. McCamish
Assistant Examiner—S. Rosasco
Attorney, Agent, or Firm—G. S. Indig

[57] ABSTRACT

Fabrication of integrated circuits—electronic, photonic or hydrid—permits attainment of higher device density. Pattern delineation with smaller design rules than previously associated with delineating radiation of given wavelength is the consequence of use of phase masks. Compared with earlier used, binary valued phase masks, the multiple values of those on which this fabrication depends permits improved effectiveness in lessening of edge-smearing radiation of consequence (of diffraction-scattered delineating radiation at feature edges). Phase masking may provide, as well, for feature generation by interference, and for reduced intensity of unwanted image hot spots by diffraction.

27 Claims, 3 Drawing Sheets

SUB-MICRON DEVICE FABRICATION WITH A PHASE SHIFT MASK HAVING MULTIPLE VALUES OF PHASE DELAY

BACKGROUND OF THE INVENTION

1. Technical Field

The invention relates to the fabrication of small-dimensioned devices, e.g. integrated circuits using sub-micron design rules and to apparatus/tools used in such fabrication. The major thrust concerns lithographic delineation—involving the use of phase masks to improve image quality. Whether based on presently used delineating energy, e.g. in the near ultraviolet spectrum, or on shorter wavelength, e.g. in the deep ultraviolet or x-ray spectrum, improvement in lithographic delineation extends the range to permit further miniaturization. Fabrication of Very Large Scale Integrated circuits—electronic as well as optical and hybrid is contemplated.

2. Description of the Prior Art

The saga of Large Scale Integration from inception to the present time is well-known. Evolution of the present 1–2 megabit chip, built to design rules at or slightly below 1 $\mu$m, does not represent the ultimate product. Lithographic definition has played, and will continue to play, a significant role. Fabrication of state-of-the-art devices depends on use of near-ultraviolet radiation (e.g. of wavelength, $\lambda = 3650$ Å—the mercury I line). Intensive effort directed toward next generation devices is expected to depend on radiation of still shorter wavelength (radiation within the "deep UV" spectrum, e.g. of wavelength, $\lambda = 2480$ Å—the krypton fluoride excimer laser line). Forward-looking work directed toward still smaller design rules contemplates electromagnetic energy in the x-ray spectrum or, alternately, accelerated electron radiation of equivalent decreased wavelength.

A competing effort seeks to extend the capability of presently used UV delineating radiation. As described in M. D. Levenson et al, *IEEE Trans. Electron Devices*, vol. ED-29 (12), p. 1828 (1982) and as reviewed in a New York Times article dated Dec. 12, 1990, design rule-limiting loss in edge resolution is lessened by use of "phase masks"—that is by use of masks designedly providing for relative phase shifting of radiation as transmitted through selected mask areas. Impact is two-fold: (1) as applied to usual device fabrication entailing opaque featured masks (e.g. chrome on glass) and (2) as applied to such fabrication entailing clear masks, dispensing with opaque mask features, in which use is made of dark-line imaging resulting from interference between transparent mask regions of differing phase delay. In either event, use of phase masks permits extension to design rules generally thought beyond the capability of the particular wavelength used with extension due to phase cancellation of diffraction-scattered, resolution-limiting radiation at feature edges. In both instances, provision is made for 180° phase shift regions—either adjacent, or as an integral part of edge-defining mask areas.

Phase masking is considered promising in accordance with traditional business considerations. Its use promises fabrication of next-generation devices using present equipment and processing. Avoidance of cost of replacement equipment (in any event not yet commercially available) as well as of retraining of personnel assures continuing effort in this direction.

A widespread view serves as basis for expected extension of UV-based processing to design rules below 0.3–0.25 $\mu$m by use of phase masking—likely to the 0.2 $\mu$m and below range commonly thought beyond the effective capability of UV delineation. To the extent that this proves to be correct, device fabrication by use of x-ray (whether by proximity or projection) as well as by use of accelerated electron radiation (whether by beam writing or masking) is likely to be deferred to the turn of the century.

Limiting lithographic resolution varies in accordance with the classical relationship:

$$\text{Resolution} = \frac{K_1 \lambda}{NA}$$

in which:

$\lambda$ = wavelength of delineating radiation in appropriate units, e.g. $\mu$m NA is the numerical aperture of the optical system Resolution is on the basis of desired feature-space contrast and $K_1$ is a constant which depends upon details of the imaging system and characteristics of the delineating process, e.g. of the development process—a value of 0.7–0.8 is characteristic of state-of-the-art fabrication (of 0.8–1.0 $\mu$m design rule LSI)

180° phase mask processing for given wavelength/etch contrast may be described in terms of reduction of $K_1$ to the $\approx 0.5$ level (permitting fabrication of devices to design rule of $\approx 0.4$ $\mu$m), and in some instances to the $\approx K_1 = 0.3$ level to yield quarter micron features.

SUMMARY OF THE INVENTION

The invention concerns the fabrication of integrated circuits as directed to electronics, photonics and combinations (hybrid circuits). It involves phase masking and, accordingly, contemplates use of design rules which approach wavelength or diffraction limits for the chosen delineating radiation. Phase masking designedly permits increasing miniaturization (feature size and/or spacing distance) and, accordingly, provides for extension of use of such delineation to smaller design rules. Delineating radiation benefitting from such improved capability, includes that in the UV spectra (either "near"—e.g. the mercury I line at 3650 Å—or "deep"—e.g. the argon fluoride excimer laser line at 2480 Å). It also includes shorter wavelength as in the x-ray spectrum. While expected to be of prime value, as applied to projection-reduction, it is applicable to contact printing—or near-contact printing e.g. to the "proximity printing" as contemplated by many workers for use with x-ray delineating radiation.

Earlier effort at phase masking is primarily based on provision for radiation of one level of phase delay differing from that of the delineating radiation as incident on the mask—a level nominally differing by 180°. As applied to cancellation/lessening of unwanted, edge-smearing, diffraction-scattered radiation, it results in marked improvement in feature resolution on the image plane.

The present invention in most instances provides for radiation of at least four distinct phase delay values as transmitted through the mask—as directly or indirectly affecting imaging. In broad terms, improvement over prior phase masking as so realized includes extension to use of but two phase delay values. In these terms, further resolution improvement for usual circuitry may be described as permitting further lessening of the magnitude of $K_1$ in the equation $$\text{Resolution} = \frac{K_1 \lambda}{NA}$$

In the terms presented above, $K_1$ may approximate 0.3 in many instances in which simple binary, 180° phase masking, permits $K_1 \approx 0.5$.

Provision of multiple phase delay values in accordance with the inventive teaching permits other advantages as well. Particularly as applied to image features as produced by interference (rather than by imaging of opaque mask features), these include facility for line termination (more generally for feature termination) as well for branching. In a very real sense, while ultimately resulting in attainability of design rules closer to the fundamental wavelength limit, these further advantages permit versatility of circuit design to include variations previously realizable only with difficulty, if at all.

Embodiments of the invention profit by provision for such regions of discrete phase delay values—e.g. of values differing by approximately 90°, sometimes by 60°, etc. Others make use of larger numbers of phase delay values, e.g. eight or more sometimes as equally spaced, as well as a greater multiplicity with small separation as approaching or effectively attaining a continuum.

Pattern delineation as improved in accordance with the inventive teaching does not cure—may under some circumstances aggravate—another problem. Examination of image wave fronts as produced e.g. by the earlier two-level phase masking reveals fabrication-significant variations in brightness, both in the image-consequential illuminated and non-illuminated regions (in the "bright" and "dark" regions). The fundamental inventive objective—that of lessening smearing effects associated with radiation as scattered at feature edges—is itself attended by positional brightness variation. Briefly, phase cancellation, whether total or partial, whether precisely compensating or over- or under-compensating, unavoidably results in energy redistribution often of consequence in these terms.

An important aspect of the invention provides for lessening of "bright spots" which do not advance patterning objectives—for darkening of regions of such increased brightness. The overall objective in striving for lessening of such bright spots in areas which are nominally uniformly illuminated in either bright or dark areas is of consequence in more than one way. For example, existence of bright spots, to the extent that they are not within the latitude of e.g. resist (composition, thickness, etc.) and development/processing (to the extent resulting in non-pattern information in the device), directly lead to decreased yield.

Depending upon location of such bright spots, they may have implications with regard to resolution—to limit choice of design rule. It is unnecessary to detail other undesirable consequences which are generally known to the artisan. For example, while the term "latitude" is generally discussed in terms of (avoidance of) unwanted feature replication, it is used with reference to (avoidance of) other feature characteristics—e.g. bright spots, depending upon location, while not replicated per se, may increase feature size—may increase line width for an adjacently positioned line. Proper mask design makes use of the invention potential by providing for lessening of such bright spots in instances in which width increase may have deleterious operational consequences, or in which increase may complicate fabrication.

The objective of brightness uniformity is, in accordance with the invention, accomplished by means of scatter-removal of offending illumination energy. Scatter-removal, in any event, provides for imposition of scatter angle as to result in removal of such illumination energy—to prevent its infringing on a device being fabricated. Scattering, in usually preferred embodiments, is the rigorously calculable consequence of familiar structures—primarily line gratings or of checkerboard configuration. Alternatively, it may be the statistical consequence of scattering centers as intensity-tailored by attention to such material/structure variables as molecular weight, concentrations of inclusions, or layer thickness. In any event, diffraction power—is sufficient to result in exclusion of energy by relevant apertures of the imaging system (of the projection system). Objectives, e.g. in terms of conditions to be remedied, or, alternatively, in terms of circuit design objectives, perhaps not otherwise provided for, may dictate correction in terms of uniform illumination, or, alternatively, of designedly non-uniform illumination. In ordered structures non-uniformity may be accomplished by variations: e.g. in phase delay difference as between lines and spaces; in the ratio of relative values of lateral widths of lines and spaces. In terms of scattering centers, variation in intensity of the fraction of energy discarded may be accommodated by: e.g., size of such centers as well as their position and induced phase delay, etc.

Devices fabricated in accordance with the invention are described in terms of a masking level—likely one of many. Attendant levels do not necessarily benefit by the inventive variations. Accordingly, fabrication may depend upon additional levels at larger design rules—levels which may not entail use of a phase mask at all.

DETAILED DESCRIPTION

Introduction

In general terms, the inventive advance depends upon device fabrication entailing mask-pattern delineation. While the principles involved are not dimension-related, primary commercial utilization is expected to be at submicron design rules. Design rules of consequence provide for dimensions regarded as wavelength or near-wavelength limited. Relevant recently reported work depends upon phase masking for realization of reduced design rules for chosen delineating radiation wavelength. Such earlier work, as described in the initial portion of this specification, is generally based on total removal of layered transparent material to reveal underlying substrate, with layer thickness such that removal results in a 180° phase shift for mask-transmitted delineating radiation.

The invention builds on earlier phase shift work in providing for additional values of phase shift—generally a total of four or more—ultimately of many more to effectively approach a continuum. Provision of four such values as utilized herein, significantly advances the objective which provoked the generic approach—that of increased device population in the usually contemplated integrated circuit. For usual circuit designs, provision of such additional phase delays permits reduced feature-to-feature spacing while retaining reduced feature size—the latter, generally realizable by simple binary phase masking.

Contemplated sub-micron design rules, as noted, suggest use of shorter wavelength delineating radiation—in turn conveniently accommodated by reflecting, rather than transmitting masks. While discussion is largely in terms of transmission, all principles addressed are applicable to reflection. For example, phase change accompanying change in path length for concerned delineating radiation, may be the result of change in relief of the surface of a reflection mask. It is considered unnecessary to detail obvious device variations so introduced—the fact that the "round trip" results in a path length change of twice that of the change in thickness (or in penetration depth), etc.

Use of radiation of a degree of coherence as implicitly required in phase masking has been recognized as permitting initial feature generation by interference as between adjacent transparent regions of differing phase delay—generally differing by a nominal value of 180°. The approach is of particular value in the definition of small opaque mask features—features of size approaching the minimum dictated by design rules (e.g. such features defined by chromium on glass). It is the general view that such small features, at least for some future device generation, will likely depend on such interference-generated features. The inventive approach offers facility as well for generation of larger features—versatility offered by e.g. diffraction gratings, as well as other interference effects. The present invention, while offering advantages in terms of opaque feature masking, is, accordingly, of greater prospective consequence for interference-generated masking.

The original objective of phase masking is retained—is advanced—by availability of four or more phase delay values. In very real terms, it goes beyond accomplishments of binary phase masking by permitting increased design versatility for interference-generated mask patterning. Line termination as well as line branching, are certainly expedited. Interference-generation of a feature line by use of but two differing phase delays results in extension of the line beyond the termination position dictated—into the succeeding region of constant phase delay (of value necessarily equal to one of the two involved in interference line generation). In similar manner, binary phase masking may prohibit feature branching due to necessary adjacency of regions of identical phase delay (of adjacent regions of one or the other of the two available values).

In common with earlier relevant phase masking, such values may, together, total 180°. Alternatively, they may total some lesser, still significant portion of 180°. The versatility of the inventive approach permits attainment of values together totalling in excess of 180°—perhaps totalling the entirety of 360°. Further improved image quality is generally realized by larger numbers of phase values—six or eight such values, or even to a virtual or true continuum—with the virtual continuum providing for a multiplicity of values of perhaps 10° or 5° separation.

The inventive approach addresses the deficiency which gave rise to earlier work in phase masking—edge smearing resulting as a consequence of diffraction-scattering of delineating radiation at feature edges. While this certainly constitutes a major objective of the invention, imaging quality may be further improved by attention to unevenness of illumination—in nominally illuminated as well as non-illuminated portions on the imaging plane. Unevenness, generally aggravated by phase cancellation (whether by binary or multiple phase masking), is addressed in accordance with a further embodiment of the invention.

Discussed in detail with reference to FIG. 8, this further embodiment depends upon diffraction-scattering to smooth out the location-dependent intensity peaks produced on the device on fabrication in the course of pattern transfer.

General description, as well as claim scope, is of sufficient breadth to include mask regions of appropriately varied absorption. Preferred embodiments, however, provide for lessening of illumination peaks by diffraction-scattering. Particularly for ordered structures—e.g. for diffraction gratings or two-dimensional "checkerboard" structures, a realized advantage concerns the facility with which the objective is achieved during, and by the same means used in patterning in the appropriate delineation level. (The grating or other structure may be created simultaneously with generation of device-relevant features.) The teaching is, however, not limited to this preferred embodiment but also contemplates use of "random" scattering centers (the teaching contemplates the statistical, or for that matter, crystallographically-ordered, scattering centers) as well.

Regardless of the form of diffraction utilized, the responsible material/structure may be independent of other regions/layers of the mask. A particularly expeditious approach from the fabrication standpoint, however, combines the diffraction function with pattern delineation. A particular approach discussed in conjunction with FIG. 8 modifies transparent regions of the mask so that the resulting structure satisfies requirements on intensity reduction by diffraction as well as phase delay requirements.

The Drawing

Figure 1:
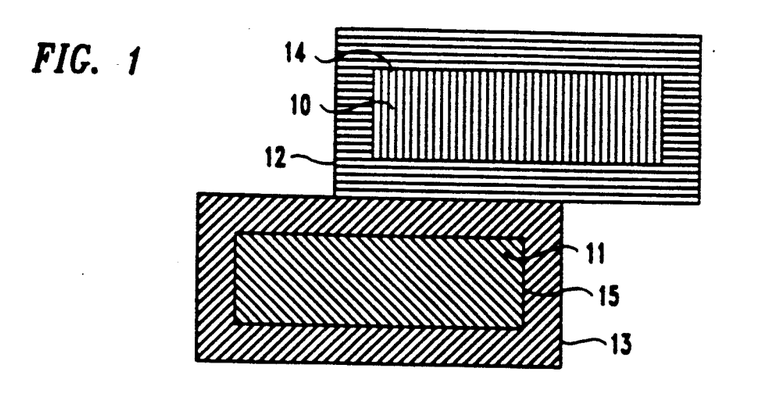
FIG. 1 schematically depicts interference-defined adjacent mask features of close spacing as expedited by use of different paired phase delay values in accordance with the invention. as appearing on the mask.

Reference is made to FIG. 1 in terms of spacing advantage realized. Earlier phase masks, whether based on opaque features or on interference patterning, under many circumstances, may result in optimally defined feature edges. A major limitation concerns spacing as between features, with minimum spacing determined by fringing (ringing), as introduced due to the now-necessary coherent nature of the delineating radiation. The very nature of phase mask-resolution improvement aggravates the amplitude of the fringing—cancellation of the diffraction-scattered smearing radiation results in increased fringing amplitude due to the addition of energy needed for cancellation. In general terms, such aggravated fringing, still as due to phase mask-improved resolution of an individual edge, while of decreasing intensity, continues to be of concern at significant distances from the relevant edge—distances greater than applicable design rules. Of even greater concern, decreased spacing as between feature edges results in statistically enhanced reinforcement to produce greater (unwanted) fringe peaking and variation in line width. In terms of earlier phase masking, invariant phase delay of diffraction-cancelling radiation results in peaking of a maximum value equal to the second power of the sum of the overlapping electric fringing fields. The general result is some considerable sacrifice of feature-to-feature spacing—generally increased to a spacing magnitude of twice the design rule (twice the minimum permitted feature dimension) or greater.

Discussion of the inventive spacing advantage is discussed in conjunction with FIG. 1. The figure depicts a mask portion including regions 10 and 11—corresponding with intended features to be produced on the device in fabrication. As in following discussion, it is convenient to refer to aspect of mask features in terms of resulting device features. While there are in fact such corresponding feature edges, it is the nature of phase masking that detailed configuration and/or positioning may be altered in the course of transfer. Discussion of this and other relevant figures is to be construed accordingly.

Regions 12 and 13 represent encompassing phase cancelling radiation regions included to increase resolution of feature edges 14 and 15, respectively. (Such feature edges, in common with other portions of the mask, are defined with regard to dark regions—e.g. as resulting from use of opaque material or by radiation removal by diffraction. dark regions—e.g. as resulting from use of opaque material or by radiation removal by diffraction.) Permitted spacing decrease relative to earlier phase masking results from use of differing "radiation phase pairs"—each pair consisting of (a) the phase of delineating radiation and (b) the phase of phase cancelling radiation, both as exiting the underside of the mask. Earlier phase masking made use of identical pairs, e.g. 0° feature regions 10 and 11, each surrounded by 180° cancelling regions 12 and 13 (regions such as 12 and 13 are denoted "compensation" regions). Decreased spacing in accordance with the invention optimally results by use of pairs which differ by 90° —e.g. feature region 10 of 0° surrounded by cancelling region 12 of 180° adjacent feature region 11 of 90° surrounded by cancelling region 13 of 270°.

Figure 2:
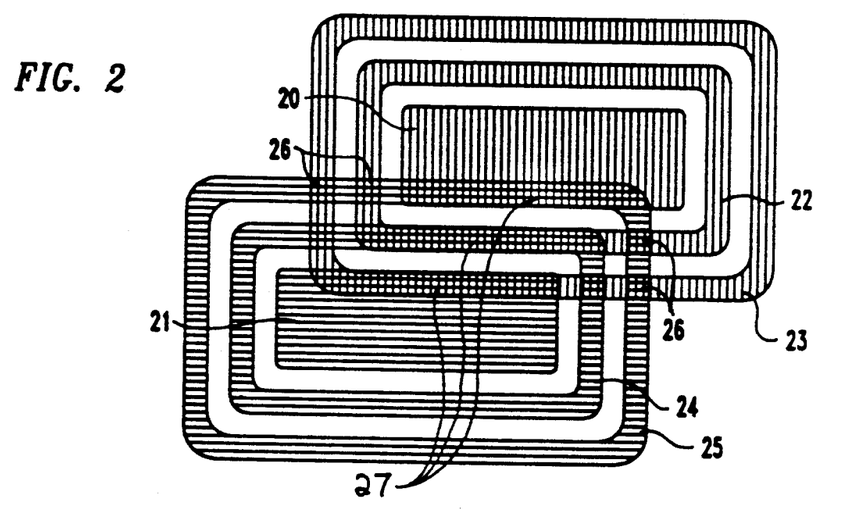
FIG. 2 schematically depicts the features of FIG. 1 as resulting in the corresponding region of the image plane.

FIG. 2, depicts the resulting images as seen on the image plane-on the surface of the device in fabrication (the term "device" is intended to encompass likely integrated circuits as well as discrete devices). Regions 20 and 21 correspond respectively with mask features 10 and 11. Each is accompanied by cyclically varying fringing field peaks, region 20 by peaks 22 and 23; region 21 by peaks 24 and 25. Earlier phase masking severely limits spacing as between features 20 and 21 due to constructive reinforcement of peaks in overlapping field regions—e.g. overlapping regions 26—with resulting unwanted energy peak intensity, I, varying as the square of the sum of the contributing electric field peaks (in this instance, $I_{26} \approx (E_{22} + E_{24})^2$, in which $E_{22}$ and $E_{24}$ are the electric fields associated with fringes 22 and 24, respectively and $I_{26}$ is the energy peak intensity associated with overlapping fringe regions 26.

For the pairs noted in FIG. 1—for the pairs 0°–180° and 90°–270°, corresponding with regions 10–12 and 11–13, respectively, resulting fringing field peaks differ in phase by 90°. In FIG. 2 this is represented by the perpendicular shading direction of fringing field peaks 22, 23 relative to 24, 25. As a consequence, "reinforcement"—since non-180°, conventionally not referred to as "interference"—is the simple arithmetic sum of the contributing peak intensities, e.g. $I_{26} \approx E_{22}^2 + E_{24}^2$. Over the anticipated range of reinforcement values—over the range anticipated on the basis of equality or near-equality of fringe fields resulting from constant delineating as well as constant compensation energy levels—the advantage of $\approx 90°$ pair variation is approximately 2× (the magnitude of overlap energy, e.g. of $I_{26}$, is reduced by approximately 50%).

Overlap fringe-feature regions 27 are included for completeness. Corresponding increase in brightness in such feature regions may present no complication—may be within the latitude of the development process. In the event a problem is introduced—e.g. in the event consequential feature spreading results—it is likely it may be accommodated by design. Alternatively, as elsewhere described, resulting increase in brightness in regions 27 (as well as in regions 26) may be accommodated by introduced gray scale, as by means of a diffraction structure.

The nature of IC processing is designed with a view to independence of pattern intensity/contrast with respect to unintended, likely encountered illumination/-processing variations. The 50% reduction should bring affected areas into a permitted range—proper choice of processing conditions may prevent replication in the developed image.

Figure 3:
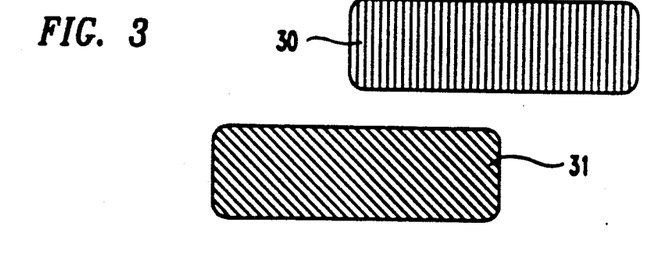
FIG. 3 depicts the features of FIGS. 1 and 2 as resulting from further processing including development.

FIG. 3 in depicting crisply defined feature regions 30 and 31 in the resulting image (corresponding with mask regions 10 and 11) is representative of realizable device pattern quality.

Figure 4:
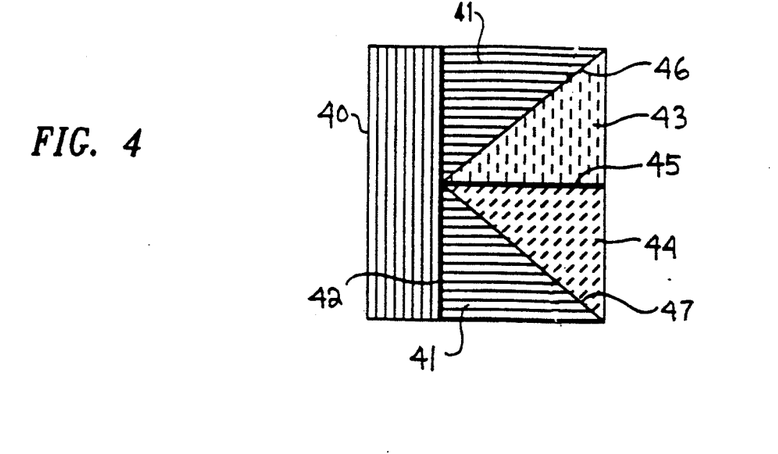
FIG. 4 is a schematic representation of an interference-generated circuit branch, first in terms of the mask, including illustrative regions of differing phase delay for generation of the feature, and second, as resulting on the device in fabrication.
Figure 5:
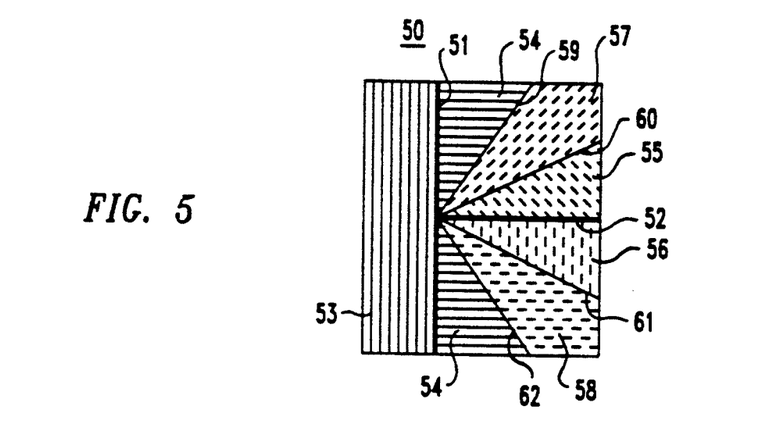
FIG. 5 in the same form as FIG. 4 is representative of a somewhat more sophisticated arrangement making use of an increased number of phase values, to produce a final developed pattern of further improved image properties.

FIGS. 4 and 5 illustrate versatility in terms of interference generation of branching circuit lines—e.g. in attainment of tee, or crossing, circuit lines. The contemplated tee feature cannot be produced by interference in a binary valued phase mask.

FIG. 4 illustrates the use of two additional phase delay values—a total of four—in the interference generation of a tee pattern. Region 40—0° couples with regions 41—180° to result in feature line 42: region 43—90° couples with region 44 to result in feature line 42, thereby completing the tee 42-45. (As elsewhere in this description, the degree indication is that of relative phase delay so that region 40—0° signifies that region 40 manifests 0° phase delay relative to a normalized delay value such as that of the incident radiation.)

Proper use of the four available values of phase delay in FIG. 4 is attended by generation of unwanted 90°-mismatched interfaces to result in ≈half brightness lines 46 and 47. While certainly somewhat limiting, material choices and development conditions may be chosen to minimize density of such unwanted features—even to result in non-retention in the final pattern.

Assuming but four values of available delay, optimal results are the consequence of pairs which differ by 90° e.g. as corresponding with region pairs 40-41 of 0°-180°, respectively and 43-44 of 90°-270°, respectively. As discussed in conjunction with FIGS. 1-3, processing is designedly independent of ≈half brightness so that the addition of contributing effects of field pairs 41-44 and 41-43, both resulting in 90° mismatch at (interfaces 47 and 46) do not result in retention of such unwanted non-patterned feature.

The mask depicted in FIG. 5 eases the demand placed on subsequent processing. This is accomplished by provision of additional phase delay values. The arrangement shown provides for generation of the same tee image, in this instance, 51-52. Tee portion 51 is the consequence of interference as between 0° (reference) phase delay region 53 and 180° phase delay regions 54. Tee line 52 is the consequence of interference again as between regions at 90° and 270°—as between regions 55 and 56. Provision of intermediate regions 57 and 58, at intermediate 45°—phase shift values of 135° and 225°, respectively lessens the intensity of unwanted lines, in this instance of lines 59, 60, 61, 62. Such intensity reduction—in contemplated instances likely to a level ≈15% of that resulting from 180° phase shifts interference, significantly reduces demand on processing. While likely not needed on the assumption of precisely defined 45° phase delay-differing regions as depicted, availability of a still greater variation of phase delay values, ultimately a continuum of such values, further eases demands on processing.

Figure 6:
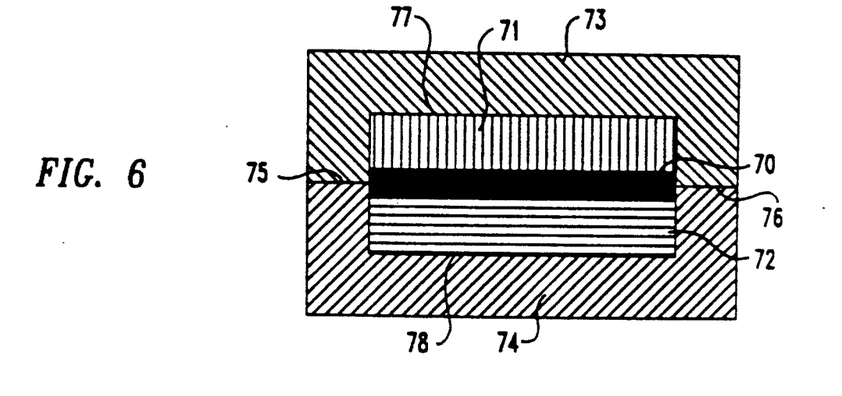
FIG. 6 again presented in the general form of FIG. 4, illustrates use of four values of differing phase delay as incident on the mask for line termination (again, of an interference-produced feature), both as appearing on the mask and as resulting on the device.
Figure 7:
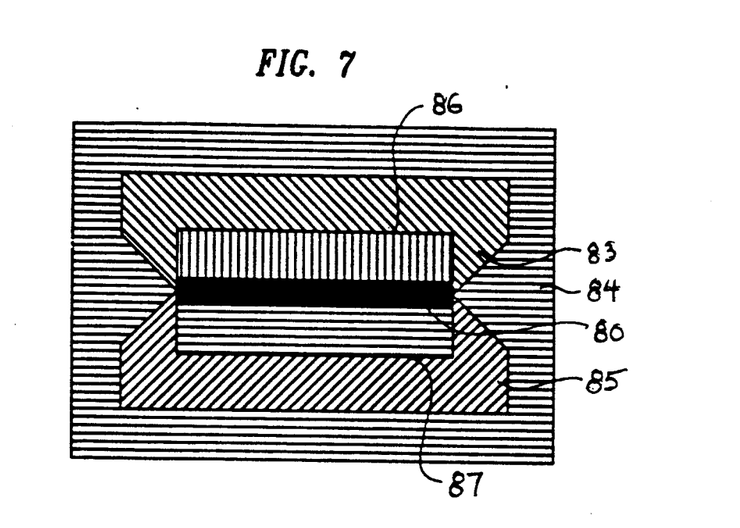
FIG. 7, in the schematic format of FIG. 6, provides for such line termination by use of delineating radiation of a larger number of phase delay values—in this instance, five values.

FIGS. 6 and 7 are concerned with termination of interference-defined lines. The mask region depicted in FIG. 6, again as viewed in terms of radiation emerging on the underside, schematically depicts line 70 as generated by interference between 0° phase delay region 71 and 180° phase delay region 72. Were there but two available phase values, line 70 would not terminate but would, in principle, continue ad infinitum. Provision of two additional values of phase delay—60° region 73 and 120° region 74—reduces the intensity at interfaces 75 and 76 to a level in the range of ≈50% to 25% that of line 70—to a level permitting termination, at least with regard to device functioning, in the developed image. Available reduction in intensity of unwanted mismatch-produced interfacial lines relative to that described in conjunction with the branching arrangement of FIG. 4 is implicit. It is of little practical consequence that line termination is attended, as well, by unwanted mismatch-resulting lines 77 and 78 since these, too, are the same intensity as that of lines 75, 76, and are eliminated through use of the same processing conditions.

FIG. 7 takes advantage of availability of a fifth value of phase delay for mask-transmitting radiation to further lessen intensity of unwanted mismatch-resulting lines. Optimization—minimization of intensity of unwanted lines—is the best use as illustrated is based upon equal region-to-region phase delay spacing (of 45°). Termination of line 80 is the consequence of confluence of the three regions 83, 84 and 85. As in the branching arrangement of the mask depicted in FIG. 5, reduction in magnitude of phase mismatch as between adjoining compensation regions, e.g. of but 45°, further reduces intensity of unwanted mismatch lines 86 and 87.

Figure 8:
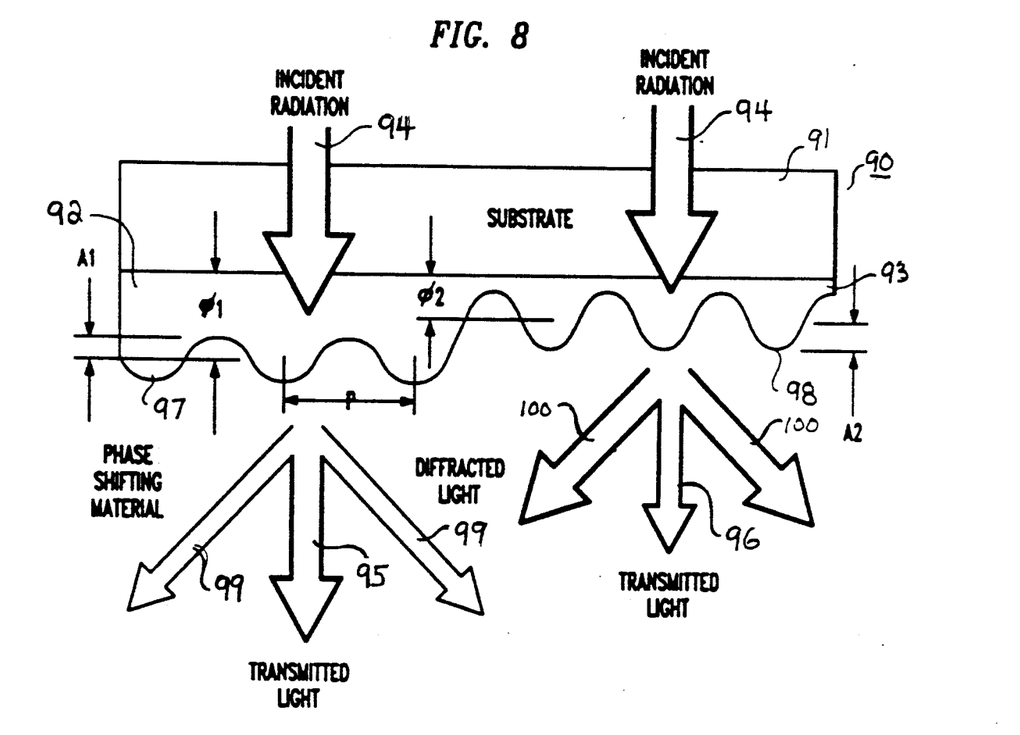
FIG. 8 is a schematic representation of an arrangement providing for phase mask resolution improvement in accordance with the major thrust of the invention, and additionally providing for lessening of uneven illumination intensity—for removal of unwanted bright spots—by means of an illustrative embodiment dependent upon use of a diffraction grating.

FIG. 8 serves as the basis for detailed description of an embodiment providing for improved brightness uniformity—either in illuminated or unilluminated regions of the pattern as projected on the device in fabrication. Basically, the figure depicts a region of a mask 90, in turn, including substrate 91 and a functional layer 92-93. Both of the layer sections, lefthand section 92 and righthand section 93 are transparent to pattern delineating radiation shown as arrows 94, and are composed of material of substantial refractive index, n, as to effectively provide for both desired phase delay and diffraction for radiation 94. Sections 92 and 93 provide both scatter-diffraction and phase delay of the preferred embodiment. Contemplated alternative structures are of many forms, e.g. including separation as between the two functions by use of a separate line grating supported on the surface of a smooth phase delay layer, etc., etc.

The figure illustrates a method of controlling the amplitude (the intensity) of the exiting radiation, 95 and 96,—that resulting from operation upon incident radiation 94 by layer sections 92 and 93, respectively. The thickness of layer sections 92 and 93—i.e. the thickness of the "phase shifting layer"—is modulated by a diffraction structure, which as shown edgewise, may be grating or checkerboard pattern. In either event, the conformation of the free surface, both that of surface 97 of section 92 and of surface 98 of section 93 is shown as sinusoidal, of amplitude A1 and A2, respectively and of period, P. The relative widths of the arrows 95 and 96 are intended to represent relative intensity of transmitted radiation—widths of arrows 99 and 100 similarly represent radiation intensity of diffracted radiation. Width variations represent relative amounts of radiation as transmitted or diffracted (the latter at such angle as to be removed—as not to be incident on the device in fabrication).

For the system depicted, gray scale introduced by section 93 is more pronounced than that introduced by section 92. The period, P, is for both sections sufficiently small that transmitted radiation has the flat wave front of radiation that has been phase shifted by a uniform layer of mean thickness, $\phi 1$ for lefthand section 92 or of $\phi 2$ for righthand section 93. Such a flat wave front is assured, for the sinusoidal surfaces shown, if P satisfies the equation:

$$P < \frac{\lambda}{NA} \text{Red.}(1 + \sigma)$$

in which:
P is the period of the grating,
λ is the wavelength (or the equivalent wavelength) of the delineating radiation
NA is the numerical aperture of the system
Red. is the (area) reduction factor of the projection system and
σ is the "filling factor" which defines the degree of coherence of the delineating radiation.
All in compatible units The fraction of light diffracted increases as the phase shift modulation approaches 180°. If lines and spaces of the grating are of equal width and of such thickness/index as to result in 180° differential phase delay, 100% of the radiation is diffracted. As an example: for layer 93, and using 0.365 micron radiation; for index of refraction, n=1.6; for average layer thickness=0.45 μm; the result is phase change $\phi2=270°$ and sinusoidal amplitude, A2=0.43 μm. Under these circumstances, there is no in-line transmission (as depicted center arrow 96 is not present).

The phase of the undiffracted energy is related to average thickness of the phase shifting layer ($\phi1$ for section 92, $\phi2$ for section 93). For the conditions implicit in FIG. 8 the phase of radiation 94 as passing through layer 93 is shifted by a value more closely approaching 180°.

Amplitude control of the phase shifted radiation, e.g. by appropriate adjustment of $\phi$, permits avoidance of over-compensation or under-compensation of unwanted edge diffraction-scattered radiation. Avoidance of over-compensation is valuable in minimizing interference fringing. Constancy of factors contributing to diffraction yields uniform gray scale within the relevant region. Variation e.g. of period, P, mean thickness $\phi$, index, n, may yield a gradual transition in gray scale to further lessen image-retained peaking.

The principles illustrated by FIG. 8 and its description may be satisfied by a number of alternative structures—all well-known to knowledgeable workers. The general principle is simply that of provision of gray scale, both as to location and magnitude, with the stated end in mind—generally with the objective of uniformity of illumination. The sinusoidal surface variation utilized in the grating is, itself, illustrative of a variety of gratings depending upon surface relief variations—likely, in layer material of constant refractive index. Such thickness variation is attainable, for example, by means of the approach of co-filed application Ser. No. 07/673,615, or, alternatively, is simulated by wave guiding as described in co-filed application Ser. No. 07/673,615 both of which are hereby incorporated by reference.

Sinusoidal surface variation is convenient—in terms of facility of design and fabrication. Variations may entail different surface configuration as well as total layer thickness removal in selective regions.

I claim:

1. Process for device fabrication comprising at least one pattern delineation step in which mask information is transferred from a mask to a transfer surface on said device, in which mask information includes device patterning information and phase compensation information for increasing edge resolution of the said pattern as transferred by means of destructive phase interference, CHARACTERIZED in that such mask provides for at least four differing values of phase delay, said four values differing by at least 45°.

2. Process of claim 1 in which such mask provides for values of phase delay in addition to the said four values.

3. Process of claim 2 in which such mask provides for at least eight values of phase delay.

4. Process of claim 3 in which a majority of such values constitutes a series of maximum value-to-value separation of 10°.

5. Process of claim 4 in which such values constitute a virtual continuum of maximum separation of 5°.

6. Process of claim 1 in which quality improvement by such compensation information includes increasing uniformity of illumination radiation within individual light or dark pattern regions as measured on the transfer surface, such compensation information resulting in decreased radiation intensity within selected pattern regions.

7. Process of claim 6 in which such decreased radiation intensity results from scattering within corresponding selected pattern regions on the mask.

8. Process of claim 7 in which substantial scattering is produced by diffraction structures on the mask.

9. Process of claim 8 in which such diffraction structures include and are functionally dependent upon alternating features of differing phase delay.

10. Process of claim 9 in which feature spacing and difference in phase delay result in diffraction within the range of from 5% to 95% of radiation at at least a position within at least one selected mask region to an extent sufficient to prevent such diffracted radiation from being received on the transfer surface.

11. Process of claim 10 in which said at least one selected mask region is a pattern region.

12. Process of claim 10 in which the magnitude of diffraction is non-uniform and position-dependent within such selected region.

13. Process of claim 12 in which non-uniformity consists essentially of increasing position-to-position diffraction in one direction within a substantial part of such selected region.

14. Process of claim 1 in which a substantial part of device patterning information consists of differing radiation phase as received on adjacent parts of the transfer surface so that related patterning is produced by phase interference.

15. Process of claim 14 in which adjacent pattern features are produced by phase interference as between paired phase values of radiation with such paired values differing whereby the amplitude of at least some interference peaks as produced by fringing at feature edges is reduced.

16. Process of claim 15 in which such paired phase values differ by approximately 90° so that as measured without reference to other radiation, one such pair is approximately 0°–180° and the other such pair is approximately 90°–270°.

17. Process of claim 14 in which compensation information includes differing phase delay values as received on adjacent regions of the transfer surface in the vicinity of a feature included in pattern delineation to lessen feature distortion.

18. Process of claim 17 in which such distortion consists essentially of unwanted feature extension beyond the termination point included in the patterning information.

19. Process of claim 18 in which adjacent regions of the transfer surface are in the vicinity of such termination point and in which such adjacent regions are of pie-shape and fan out from a vertex at such point.

20. Process of claim 19 in which there are at least three such adjacent regions of phase delay values both equally spaced in terms of phase delay difference and of series from a minimum of 0° to a maximum of 180° phase delay.

21. Process of claim 20 in which there are at least four such adjacent regions.

22. Process of claim 17 in which adjacent regions are in the vicinity of a pattern feature branch point.

23. Process of claim 1 in which phase variation is produced by attendant variation in path length over which mask information is transferred.

24. Process of claim 23 in which variation in path length corresponds with thickness variation of a mask layer as traversed by illumination radiation.

25. Process of claim 23 in which variation in path length corresponds with variation in index of refraction for illumination radiation within a mask layer.

26. Process of claim 1 in which such mask is a transmission mask.

27. Process of claim 1 in which such mask is a reflection mask.

* * * * *